(12) United States Patent
Komatsu

(10) Patent No.: US 6,977,525 B2
(45) Date of Patent: Dec. 20, 2005

(54) CURRENT DRIVER CIRCUIT

(75) Inventor: Yoshihide Komatsu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 103 days.

(21) Appl. No.: 10/701,500

(22) Filed: Nov. 6, 2003

(65) Prior Publication Data
US 2004/0169526 A1 Sep. 2, 2004

(30) Foreign Application Priority Data
Feb. 18, 2003 (JP) .............................. 2003-039375

(51) Int. Cl.[7] ........................................ H03K 19/0175
(52) U.S. Cl. ............................. 326/83; 326/87; 326/30
(58) Field of Search .............................. 326/26, 27, 30, 326/82–86

(56) References Cited

U.S. PATENT DOCUMENTS

| 5,418,478 | A | | 5/1995 | Van Brunt et al. |
| 5,694,060 | A | | 12/1997 | Brunt et al. |
| 5,939,904 | A | * | 8/1999 | Fetterman et al. ............ 327/67 |
| 5,977,797 | A | * | 11/1999 | Gasparik ....................... 326/86 |
| 6,329,843 | B1 | * | 12/2001 | Hirata et al. ................... 326/82 |
| 6,362,667 | B2 | | 3/2002 | Killat et al. |
| 6,646,482 | B2 | * | 11/2003 | Takeuchi ..................... 327/112 |
| 6,731,135 | B2 | * | 5/2004 | Brunolli ....................... 326/83 |
| 6,803,790 | B2 | * | 10/2004 | Haycock et al. .............. 326/82 |
| 6,836,149 | B2 | * | 12/2004 | Chow .......................... 326/83 |

FOREIGN PATENT DOCUMENTS

| CN | 1293495 A | 5/2001 |
| CN | 1314027 A | 9/2001 |
| JP | 2001-186197 A | 7/2001 |

* cited by examiner

*Primary Examiner*—Don Le
(74) *Attorney, Agent, or Firm*—McDermott Will & Emery LLP

(57) ABSTRACT

A current driver circuit has a current driver and a current compensation circuit. The current driver has a current source transistor connected to a power source potential level, while it is coupled to a pair of transmission lines. The current compensation circuit is coupled to the output side of the current source transistor for the compensation of an output current from the current driver in response to a common mode potential of the pair of transmission lines.

8 Claims, 7 Drawing Sheets

US 6,977,525 B2

CURRENT DRIVER CIRCUIT

BACKGROUND OF THE INVENTION

The present invention relates to a current driver circuit for high-speed differential transmission.

With the rapid proliferation of consumer equipment including a digital broadcasting TV and a DVD device, there has been increasing need for high-speed data transmission. To respond to the need, high-speed serial data interface standards such as IEEE 1394 and Serial-ATA have been adopted broadly in the market. According to these high-speed serial data interface technologies, data in an LSI is transmitted differentially at a high speed by a current driver circuit and even high-speed data transmitted from outside the LSI is received differentially by a receiver circuit within the LSI via a pair of transmission lines (twist pair cable).

Because such differential transmission performs long-distance transmission by using a pair of transmission lines, an analog circuit is used in most cases for an input/output unit and a 3.3-V CMOS (Complementary Metal Oxide Semiconductor) transistor is used for the analog circuit. The use of the 3.3-V CMOS transistor is inevitable in terms of protecting a device from an external influence such as ESD (Electrostatic Discharge). It is also necessary in performing differential transmission to determine a common mode potential which is an intermediate potential between a differential pair of signals used for the transmission. If different common mode potentials are set at the transmitter and the receiver, however, a potential difference is inevitably produced on both sides so that a current flows into either of the transmitter and the receiver. To prevent this, it is typical for either the transmitter or the receiver to determine the common mode potential. Accordingly, the common mode potential is normally unfixed and allowed to have a specified range in most cases.

FIG. 8 is a structural view of a conventional current driver circuit for performing differential transmission (see, e.g., U.S. Pat. Nos. 5,418,478 and 5,694,060).

As shown in FIG. 8, the current driver circuit 1 comprises: a pMOS current source transistor 2 connected to a power source potential level $V_{dd}'$; an nMOS current source transistor 3 connected to a ground level $V_{ss}'$; and a switch circuit 4 consisting of four switch elements connected between the pMOS current source transistor 2 and the nMOS current source transistor 3. A pair of transmission lines TP'/NTP' having respective terminal resistors R' composed of two series circuits are connected to the switch circuit 4.

In the conventional current driver circuit 1, a current flows from the pMOS current source transistor 2 through the terminal resistors R' connected between the pair of transmission lines TP'/NTP' via the switch circuit 4 to be drawn into the nMOS current source transistor 3 again via the switch circuit 4. At this time, a current flowing through the terminal resistors R' of the pair of transmission lines TP'/NTP' generates an amplitude using a common mode potential $V_{cm}'$ as a center potential. The amplitude thus generated, i.e., the direction of the current flowing through the terminal resistors R' allows the current driver circuit 1 to transmit an output "1" or "0".

However, since the common mode potential varies from 0.5 V to about 2.5 V in accordance with, e.g., the IEEE 1394 standard or the like, there is a case where the difference between the power source potential level $V_{dd}'$ and the common mode potential $V_{cm}'$ becomes 0.2 V if the power source potential level $V_{dd}'$ is lowered to, e.g., 2.7 V. In such as a case, the pMOS current source transistor 2 of the current driver circuit 1 inevitably enters a non-saturated region so that the lowering of the power source potential level $V_{dd}'$ is limited. Since the common mode potential $V_{cm}'$ is high, if a voltage impressed on the both ends of the pMOS current source transistor 2 reaches a value lower than the voltage obtained by subtracting the threshold voltage from the gate voltage, it is difficult to design the pMOS current source transistor 2 such that it reaches a saturated region in terms of the size of the transistor.

SUMMARY OF THE INVENTION

In view of the foregoing, it is therefore an object of the present invention to allow a current driver circuit for differential transmission to perform high-speed differential transmission even if a common mode potential is changed to a wide-range potential.

A first current driver circuit according to the present invention is a current driver circuit for driving a pair of transmission lines by allowing a current to flow in a terminal resistor connected between the pair of transmission lines, the current driver circuit comprising: a current driver having a current source transistor connected to a current source potential level, the current driver being coupled to the pair of transmission lines; and a current compensation circuit for compensation of an output current from the current driver in response to a common mode potential of the pair of transmission lines, the current compensation circuit being coupled to an output side of the current source transistor.

In the first current driver circuit, the current compensation circuit is coupled to the output side of the current source transistor connected to the power source potential level and the current compensation circuit is constituted to perform the compensation of the output current from the current driver in response to a variation in the common mode potential of the pair of transmission lines. The arrangement allows the current compensation circuit to supply a current to the current driver even when the current source transistor enters a non-saturated region due to a high common mode potential, i.e., even when the output current from the current driver is reduced so that the amount of the output current is adjusted to an appropriate value. Consequently, differential signals can be outputted stably even during a low-voltage operation in which power source potential level is low. Accordingly, there is implemented a current driver circuit capable of high-speed differential transmission even if the common mode potential varies in a wide range.

In the first current driver circuit, the current compensation circuit can initiate the compensation of the output current when a difference between the power source potential level connected to the current source transistor and the common mode potential becomes smaller than a specified value.

This allows the current compensation circuit to initiate the compensation of the output current from the current driver with a timing with which the compensation of the output current becomes necessary.

In the first current driver circuit, the current compensation circuit preferably increases the output current by a reduction in the current when the current source transistor enters a non-saturated region.

In the arrangement, the current corresponding to the reduction in output current is supplied from the current compensation circuit to the current driver. This allows the output current to be increased to the level when the current source transistor is operating in a saturated region.

In the first current driver circuit, the current compensation circuit preferably comprises: a plurality of resistors connected in series between the power source potential level and a ground level; a comparator for making a comparison between a terminal potential of each of the plurality of resistors and the common mode potential; a load transistor activated by a reversal of a magnitude relationship between the common mode potential inputted to the comparator and the terminal potential; and a Miller transistor for supplying, to the current driver, a current directly proportional to a current flowing in the load transistor.

The arrangement allows the comparator provided in the current compensation circuit to make a comparison between the specified terminal potential determined by the plurality of resistors and the common mode potential. Specifically, the comparator is so constituted as to activate the load transistor connected to the comparator when the magnitude relationship between the inputted terminal potential and the common mode potential is reversed. In addition, the Miller transistor is provided in the activated load transistor so that a current directly proportional to the current flowing in the load transistor flows in the Miller transistor. If the current flowing in the Miller transistor is supplied to the current driver, the compensation of the output current from the current driver can be performed. The comparator also allows the terminal potential compared with the common mode potential to be determined arbitrarily. If the terminal potential is adjusted to be equal in level to the common mode potential when the current source transistor enters the non-saturated region, the current can be supplied constantly from the current compensation circuit to the current driver when the current source transistor is in the non-saturated region.

In this case, the current compensation circuit preferably further comprises a transistor provided between the power source potential level and the ground level and connected in series to the plurality of resistors.

In the arrangement, the current flowing in the plurality of resistors is less likely to be varied by a variation in power source potential level or ground level. Accordingly, the terminal potential becomes more stable than in the case where only the plurality of resistors are connected in series. This allows more precise compensation of the output current from the current driver.

In addition, the comparator preferably comprises a first nMOS transistor having a gate to which the common mode potential is inputted, a second nMOS transistor having a gate to which the terminal potential is inputted, and a first current source having one end connected to each of the first and second nMOS transistors, the load transistor is preferably composed of a pMOS transistor connected in parallel to a second current source transistor and having one end connected to the first nMOS transistor, and the current supplied from the Miller transistor to the current driver is preferably given by: $\{\beta\times(V_{gs}-V_t)^2-I\}\times\alpha$ (where $V_{gs}$ is a potential difference between a source and the gate of the first nMOS transistor, $V_t$ is a threshold voltage of the first nMOS transistor, $\beta$ is a constant determined by a channel width, a channel length, and the like of the first nMOS transistor, I is a current flowing in the second current source, and $\alpha$ is a Miller ratio of a drain current of the Miller transistor to a drain current of the load transistor).

The arrangement allows the load transistor that has been completely turned Off because of its connection to the second current source to be turned On when the magnitude relationship between the common mode potential inputted to the gate of the first nMOS transistor and the specified terminal potential inputted to the gate of the second nMOS transistor is reversed. The drain current in the load transistor at this time is obtained by subtracting the current flowing in the second current source from the drain current in the first nMOS transistor. If the drain current in the MOS transistor is assumed to be based on the square law, the drain current in the load transistor is given by $\{\beta\times(V_{gs}-V_t)^2-I\}$. In the Miller transistor constituted with a given Miller ratio, therefore, the drain current which is $\alpha$-fold the drain current in the load transistor flows so that the drain current in the Miller transistor, i.e., the current supplied from the Miller transistor to the current driver is given by $\{\beta\times(V_{gs}-V_t)^2-I\}\times\alpha$. Even in the case where the value $(V_{gs}-V_t)$ is varied by a variation in common mode potential, the current which is $\alpha$-fold the amount of the current corresponding to the variation can be supplied to the current driver with the proper timing if the Miller ratio $\alpha$ and the constant $\beta$ are determined properly. In short, the output current from the current driver can be adjusted to an appropriate amount.

Preferably, the first current driver circuit further comprises a switch for disconnecting the current compensation circuit from the current driver.

The arrangement allows a transmission method for performing communication by using a change in common mode potential to be implemented also in the present current driver circuit. Since the current compensation circuit performs the compensation of the output current from the current driver in response to the change in common mode potential, the current compensation circuit may present an obstacle in implementing the transmission method. However, the transmission method in which the current compensation circuit does not present an obstacle can be implemented if the switch for disconnecting the current compensation circuit from the current driver when necessary is further provided.

A second current driver circuit according to the present invention is a current driver circuit for driving a pair of transmission lines by allowing a current to flow in a terminal resistor connected between the pair of transmission lines, the current driver circuit comprising: a current driver having a plurality of switch circuits for controlling a current flowing in the pair of transmission lines; and a current compensation circuit for controlling stepwise respective operations of the plurality of switch circuits in response to a variation in a common mode potential of the pair of transmission lines.

In the second current driver circuit, the current driver comprises the plurality of switch circuits which are provided in parallel relation and the current compensation circuit for controlling stepwise the respective operations of the plurality of switch circuits in response to the change in common mode potential. The arrangement allows the current compensation circuit to control stepwise the respective operations of the plurality of switch circuits connected in parallel even when the voltage impressed on the current source transistor provided in the current driver to supply the current for driving the pair of transmission lines lowers in response to the change in common mode potential. Consequently, the output current from the current driver can be adjusted to a proper amount. In other words, as the plurality of switch circuits are activated stepwise, the total transistor size of switch elements composing the activated switch circuits are also increased stepwise so that a current shortage which occurs when the current source transistor enters the non-saturated region is compensated for. This allows the compensation of the output current from the current driver to be performed Accordingly, the differential signals can be outputted even during a low-voltage operation in which the power source potential level is low so that a current driver circuit capable of high-speed differential transmission even when the common mode potential varies in a wide range is implemented. If the voltage impressed on the current source transistor is sufficiently high, the number of the activated switch circuits can be reduced so that the total transistor size of the switch elements composing the activated switch circuits is reduced advantageously. As a result, switching noise can be reduced.

In the second current driver circuit, the current compensation circuit preferably operates stepwise the plurality of switch circuits as a difference between a power source potential level and the common mode potential is reduced.

The arrangement increases the number of the switch circuits which are activated gradually as the common mode potential becomes higher and thereby reliably achieves the foregoing effect.

In the second current driver circuit, the current compensation circuit preferably operates stepwise the plurality of switch circuits such that a total transistor size of the activated ones of switch elements composing the plurality of switch circuits varies non-linearly relative to a difference between the common mode potential and a power source potential level.

The arrangement achieves a reduction in the number of the switch circuits provided in the current driver. This is because, when the current source transistor provided in the current driver to supply the current for driving the pair of transmission lines is in the non-saturated state, the current flowing in the current source transistor changes non-linearly relative to the difference between the common mode potential and the power source potential level. Accordingly, proper compensation of the output current can be performed if the total transistor size of the activated ones of the switch elements composing the activated switch circuits is similarly changed non-linearly. As a result, the provision of an excessive number of switch circuits can be circumvented.

In the second current driver circuit, the specified one of the plurality of switch circuits preferably comprises a resistor connected in series between a switch element composing the specified switch circuit and one of the pair of transmission lines.

When the specified switch circuit provided with the resistor is activated in the arrangement, the terminal resistor connected to the pair of transmission lines becomes in parallel with the resistor provided in the specified switch circuit so that the overall resistance value is reduced advantageously. Accordingly, the voltage impressed on the current source transistor for supplying the current can be increased. Even when the current source transistor enters the non-saturated region, it can be brought again into the saturated region.

In the second current driver circuit, each of switch elements composing the plurality of switch circuits is preferably composed of a MOS transistor and the MOS transistor preferably has a gate connected to a ground level via a given resistor.

In the arrangement, each of the MOS transistors (switch elements) composing the plurality of switch circuits has a gate connected to the ground level via the resistor. This prevents the situation in which the switch element becomes a source for generating noise due to the size thereof. If the line connected for the inputting of a signal to the gate of each of the switch elements is elongated, on the other hand, the problem is encountered that the input signal is reflected due to the relationship between frequency and phase. However, the problem can be lessened by connecting each of the gates to the ground level via the resistor, as described above.

In the second current driver circuit, each of the switch elements composing the plurality of switch circuits is preferably composed of a miniaturized MOS transistor.

In the arrangement, each of the MOS transistors (switch elements) composing the plurality of switch circuits has been miniaturized so that a leakage current flows from the gate of the MOS transistor. Since the path of the leakage current can be used as a replacement for the virtual resistor, the foregoing problems of noise and reflection can be lessened.

DETAILED DESCRIPTION OF THE INVENTION

Embodiment 1

A current driver circuit according to a first embodiment of the present invention will be described herein below with reference to the drawings.

Figure 1:
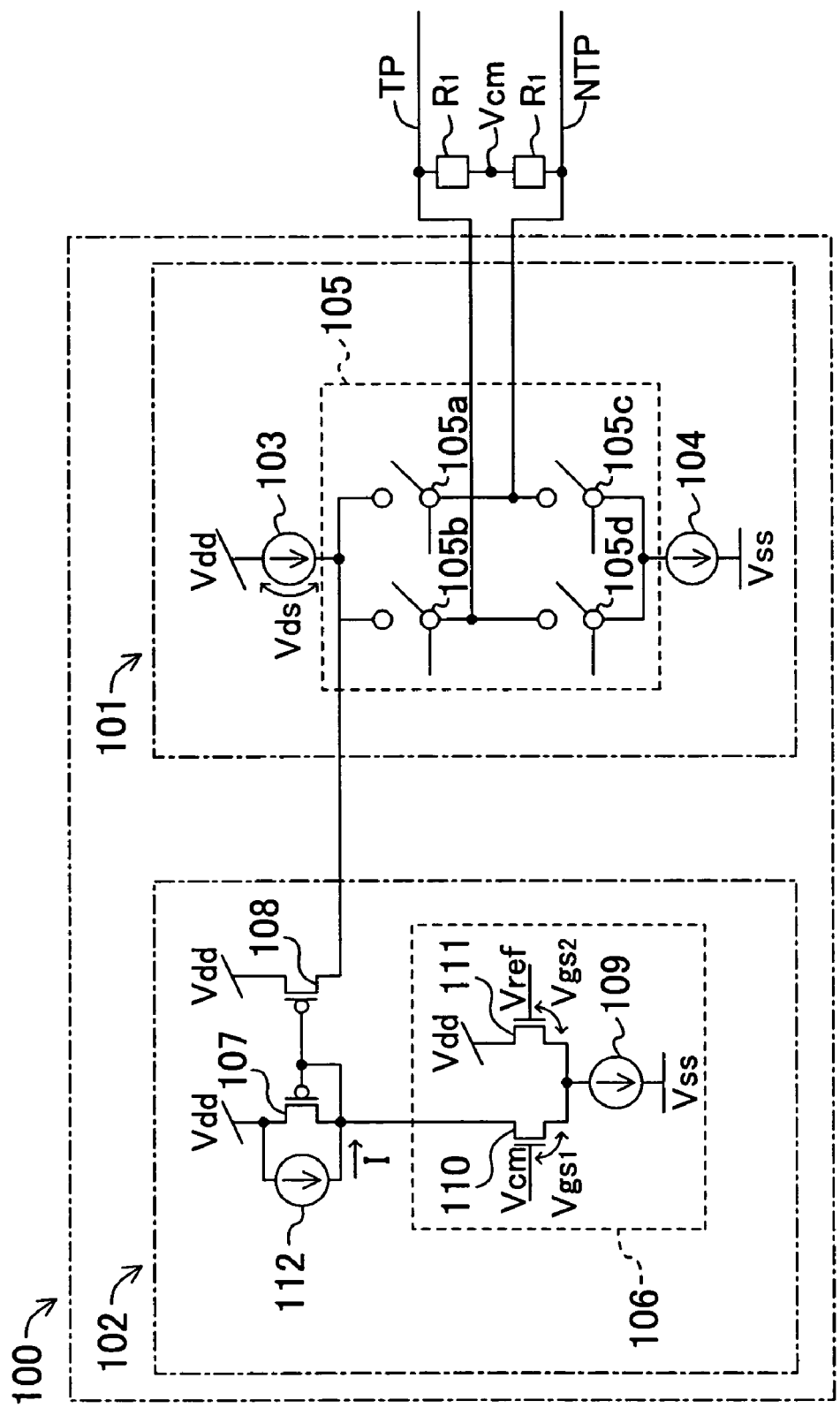
FIG. 1 is a structural view of a current driver circuit according to a first embodiment of the present invention.

FIG. 1 is a circuit diagram of the current driver circuit according the first embodiment, specifically a current driver circuit comprising a current driver and a current compensation circuit.

As shown in FIG. 1, the current driver circuit 100 comprises the current driver 101 and the current compensation circuit 102.

The current driver 101 comprises: a pMOS current source transistor 103 connected to a power source potential level $V_{dd}$; an nMOS current source transistor 104 connected to a ground level $V_{ss}$; and a switch circuit 105. The switch circuit 105 is composed of first and second switch elements 105a and 105b each composed of, e.g., a pMOS transistor and third and fourth switch elements 105c and 105d each composed of, e.g., an nMOS transistor. A pair of transmission lines TP/NTP are connected between the first and third switch elements 105a and 105c and between the second and fourth switch elements 105b and 105d, respectively. Two series circuits composing respective first terminal resistors $R_1$ are connected to the pair of transmission lines TP/NTP. In the drawing, $V_{cm}$ denotes a common mode potential for the pair of transmission lines TP/NTP.

The current compensation circuit 102 comprises: a first comparator 106; a load transistor 107; and a Miller transistor 108. The first comparator 106 comprises a first current source 109 connected to the ground level $V_{ss}$, a first nMOS transistor 110 having a source connected to the first current source 109, and a second nMOS transistor 111 having a source connected to the first current source 109 and a drain connected to the power source potential level $V_{dd}$. The load transistor 107 is composed of a pMOS transistor having a source connected to each of the power source potential level $V_{dd}$ and the input side of the second current source 112 and a drain connected to each of the drain of the first nMOS transistor 110 and the output side of the second current source 112. The Miller transistor 108 is composed of a pMOS transistor having a source connected to the power source potential level $V_{dd}$, a gate connected to each of the gate and drain of the load transistor 107, and a drain connected to the drain side of the first pMOS current source transistor 103 of the current driver 101. In the drawing, $V_{gs1}$ denotes a potential difference between the source and gate of the first nMOS transistor 110, $V_{gs2}$ denotes a potential difference between the source and gate of the second nMOS transistor 111, and I denotes a current flowing in the second current source 112.

According to the first embodiment, a current supplied from the pMOS current source transistor of the current driver 101 flows through the first terminal resistors $R_1$ connected between the pair of transmission lines TP/NTP via the switch circuit 105 to be drawn into the nMOS current source transistor 104 again via the switch circuit 105. At this time, a potential difference is produced between the both ends of the first terminal resistors $R_1$ (between the pair of transmission lines TP/NTP). As a result, a signal having a given amplitude is outputted. However, the common mode potential $V_{cm}$ which is generated by a node outside an LSI varies in a wide range, while a common mode potential $V_{cm}$ which is generated from a node inside the LSI including the current driver circuit 100 is held constant. If the common mode potential $V_{cm}$ changes in the direction of the power source potential level $V_{dd}$, the voltage impressed on the pMOS current source transistor 103 is reduced so that the pMOS current source transistor 103 enters a non-saturated region. Consequently, an output current supplied through the pMOS current source transistor 103 is reduced. According to the present embodiment, however, the current compensation circuit 102 initiates operation at the same time as the pMOS current source transistor 103 enters the non-saturated region. As a result, the amount of the output current from the current driver 101 can be adjusted to an appropriate value.

A detailed description will be given herein below to the operation of the current compensation circuit 102.

The common mode potential $V_{cm}$ has been inputted to the gate of the first nMOS transistor 110 composing the first comparator 106 of the current compensation circuit 102, while a given first reference potential $V_{ref1}$ has been inputted to the gate of the second nMOS transistor 111. The first comparator 106 controls the load transistor 107 by outputting a result of making a comparison between the two potentials to the gate of the load transistor 107. Specifically, the current compensation circuit 102 is constituted such that the magnitude relationship between the common mode potential $V_{cm}$ and the first reference potential $V_{ref1}$ is reversed when the potential difference between the common mode potential $V_{cm}$ and the power source potential level $V_{dd}$ becomes a given value or smaller. As a result, the load transistor 107 that has been turned Off completely by the second current source 112 is turned On. The turning On of the load transistor 107 allows the Miller transistor 108 provided in the load transistor 107 to be turned On simultaneously. A drain current at a given Miller ratio α to a drain current in the load transistor 107 flows in the Miller transistor 108 to be supplied to the drain side of the pMOS current source transistor 103 of the current driver 101. The respective threshold voltages of the load transistor 107 and the Miller transistor 108 have been adjusted to be equal to each other.

With the common mode potential $V_{cm}$ approaching the power source potential level $V_{dd}$, the current compensation circuit 102 initiates the operation even when the pMOS current source transistor 103 enters the non-saturated region so that the amount of the output current from the current driver 101 is adjusted successfully to an appropriate value. Specifically, if the first and second nMOS transistors 110 and 111 are assumed to have identical structures, the drain current in the first nMOS transistor 110 is given by $\beta \times (V^{gs1}-V_t)^2$ and the drain current in the second nMOS transistor 111 is given by $\beta \times (V_{gs2}-V_t)^2$ where β represents a constant determined by the respective channel widths, channel lengths, and the like of the first and second nMOS transistors 110 and 111 and $V_t$ represents the threshold voltage of each of the first and second nMOS transistors 110 and 111. Consequently, a current given by $\beta \times \{(V_{gs1}-V_t)^2 + (V_{gs2}-V_t)^2\}$ flows in the first current source 109, while the drain current in the load transistor 107 is given by $\{\beta \times (V_{gs1}-V_t)^2 - I\}$. Accordingly, the drain current in the Miller transistor 108 becomes α-fold the drain current in the load transistor 107, which is given by $\{\beta \times (V_{gs1}V_t)^2 - I\} \times \alpha$. In the case where the value used actually, specifically $V_{gs2}$, is assumed to be $\{V_{dd}-(26/30) \times V_{dd}\}$, if the current flowing in the first current source 109 is 60 μA and the current flowing in the second current source 112 is 2 μA, the drain current in the load transistor 107 is given by $\{\beta \times (V_{gs1}-V_t)^2 - 2 \mu A\}$ and the drain current in the Miller transistor 108 is given by $\{\beta \times (V_{gs1}-V_t)^2 - 2 \mu A\} \times \alpha$. It follows therefore that the foregoing current is supplied to the drain side of the pMOS current source transistor 103 of the current driver 101. The current thus supplied to the current driver 101 increases as the common mode voltage $V_{cm}$ increases and can be set arbitrarily by adjusting α, β, $V_t$, and $V_{ref1}$. If the Miller ratio α and the constant β are determined properly, even when the value $(V_{gs}-V_t)$ varies with a variation in common mode potential $V_{cm}$, a current corresponding to α-fold the amount of current variation can be supplied with an appropriate timing to the current driver 101. This allows the amount of the output current from the current driver 101 to be adjusted to a proper value. As a result, even a low-voltage operation at a low power source potential level $V_{dd}$ as described above allows a stable differential signal to be outputted so that a current driver circuit capable of performing high-speed differential transmission even if the common mode potential $V_{cm}$ varies in a wide range is implemented.

Although the first embodiment has specified the structure of the current compensation circuit 102, another structure may also be used provided that it allows the compensation of the output current from the current driver 101 depending on a variation in common mode potential $V_{cm}$.

Although the first embodiment has specifically determined the respective values of the current flowing in the first current source 109, the current flowing in the second current source 112, and the voltage $V_{gs2}$ applied between the source and gate of the second nMOS transistor 111, these values may be determined arbitrarily in accordance with the characteristics of a current driver to be fabricated.

Embodiment 2

A current driver circuit according to a second embodiment of the present invention will be described herein below with reference to the drawings.

Figure 2:
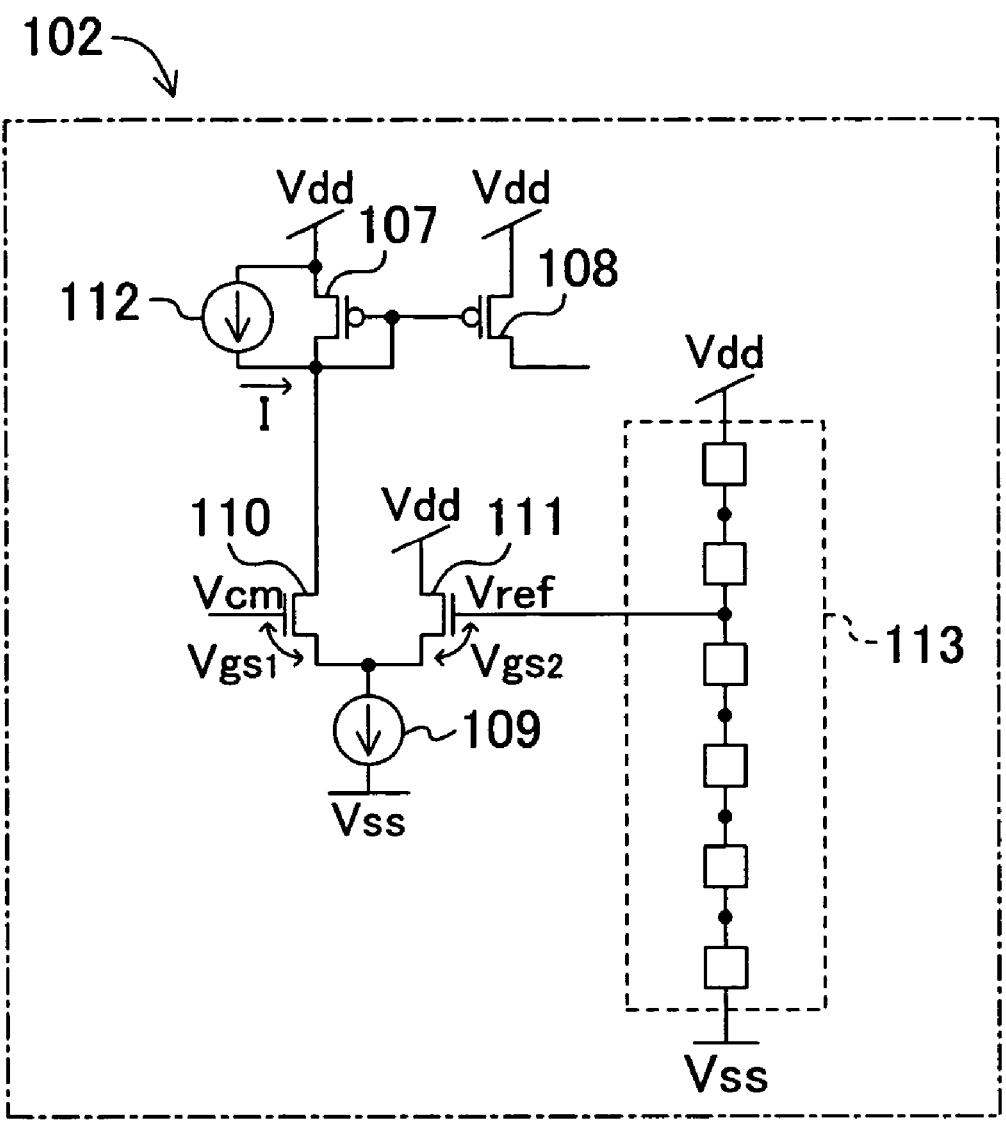
FIG. 2 is a structural view of a current compensation circuit composing a current driver circuit according to a second embodiment of the present invention.

FIG. 2 is a structural view of a current compensation circuit composing the current driver circuit according to the second embodiment. The current driver circuit according to the present embodiment is not depicted herein because it is the same as the current driver 101 according to the first embodiment shown in FIG. 1. The same reference numerals are retained for the circuit components and the like of the current compensation circuit according to the second embodiment which are the same as those of the current compensation circuit 102 according to the first embodiment.

As shown in FIG. 2, the current driver circuit according to the present embodiment is characterized in that the first reference potential $V_{ref1}$ inputted to the gate of the second nMOS transistor 111 composing the current compensation circuit 102 according to the first embodiment shown in FIG. 1 is generated by using a first reference potential generating circuit 113, which will be described specifically herein below.

The first reference potential generating circuit 113 is composed of a plurality of resistors connected in series between the power source potential level $V_{dd}$ and the ground level $V_{ss}$. One of terminals between the adjacent ones of the plurality of resistors is connected to the gate of the second nMOS transistors 111. Consequently, that one of different terminal potentials generated between the individual resistors which has a specified value is inputted as the first reference potential $V_{ref1}$ to the gate of the second nMOS transistor 111. Since the first reference potential $V_{ref1}$ can be determined based on the terminal potential having the specified value, the first reference potential $V_{ref1}$ can be determined arbitrarily. The selection of a proper terminal potential allows the current compensation circuit 102 to initiate operation at the same time as the pMOS current source transistor 103 enters the non-saturated region.

Variation of Embodiment 2

A current driver circuit according to a variation of the second embodiment will be described herein below with reference to the drawings.

Figure 3:
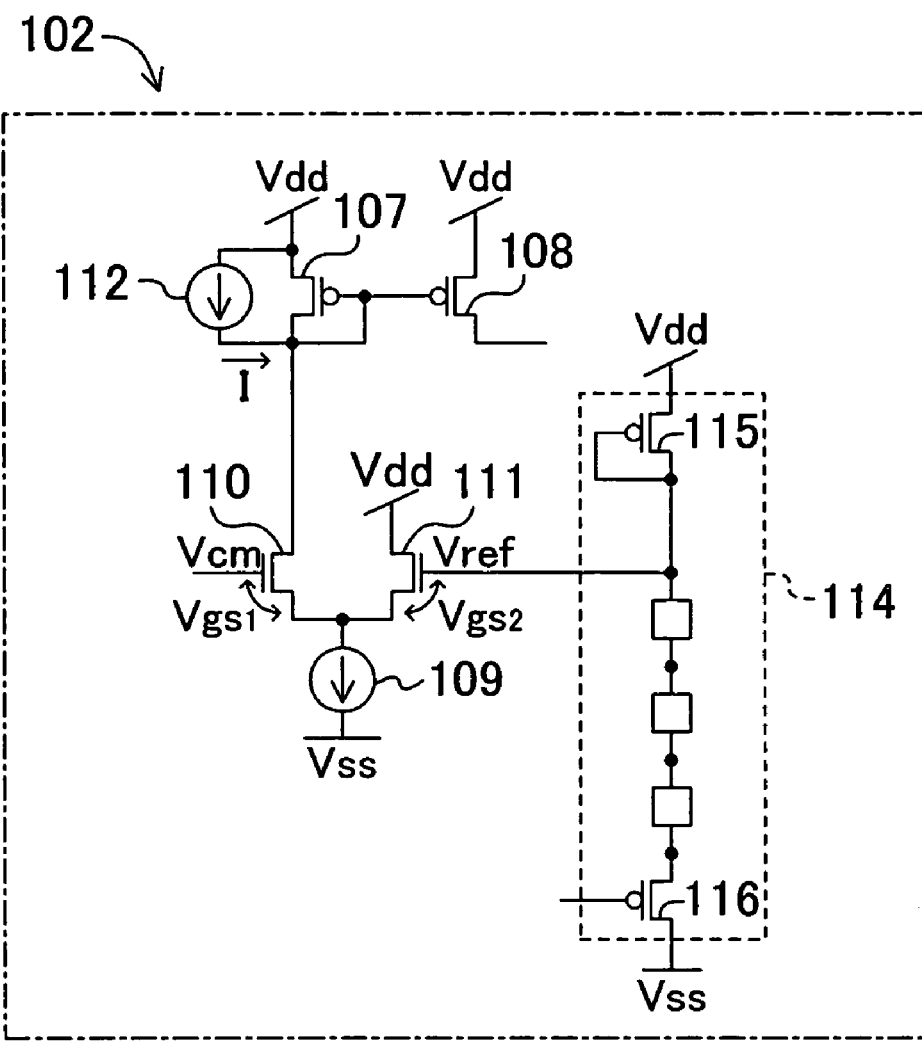
FIG. 3 is a structural view of a current compensation circuit composing a current driver circuit according to a variation of the second embodiment.

FIG. 3 is a structural view of a current compensation circuit composing the current driver circuit according to the variation of the second embodiment. The current driver circuit according to the present variation is not depicted herein because it is the same as the current driver 101 according to the first embodiment shown in FIG. 1. The same reference numerals are retained for the circuit components and the like of the current compensation circuit composing the current driver circuit according to the present variation shown in FIG. 3 which are the same as those of the current compensation circuit according to the second embodiment shown in FIG. 2.

As shown in FIG. 3, the current driver circuit according to the present variation is characterized by a second reference potential generating circuit 114 obtained by improving the first reference potential generating circuit 113 according to the second embodiment shown in FIG. 2, which will be described specifically.

According to the present variation, the second reference potential generating circuit 114 is composed of a plurality of resistors connected between the power source potential level $V_{dd}$ and the ground level $V_{ss}$ and first and second pMOS transistors 115 and 116 each connected in series to these resistors. Consequently, a current flowing in the first pMOS transistor 115 is stable even when the power source potential level $V_{dd}$ or the ground level $V_{ss}$ varies so that a current flowing in the resistors is less likely to vary. This stabilizes the terminal potential inputted as the first reference potential $V_{ref1}$ and thereby allows more precise compensation of the output current from the current driver.

According to the present variation, the second pMOS transistor 116 is connected in series to the plurality of resistors and the gate voltage of the second pMOS transistor 116 can be changed arbitrarily. This allows On/Off control of the second pMOS transistor 116 by controlling the potential inputted to the gate of the second pMOS transistor 116. In the arrangement, if the second pMOS transistor 116 is turned On, e.g., a specified first reference potential $V_{ref1}$ is generated so that the output current from the current driver 101 is subjected to proper compensation depending on a variation in common mode potential $V_{cm}$. If the second pMOS transistor 116 is turned Off, on the other hand, a current does not flow in each of the resistors so that the first reference potential $V_{ref1}$ reaches a value close to the power source potential level $V_{dd}$. In other words, the current compensation circuit 102 no more operates even when the common mode potential $V_{cm}$ changes. In short, the second pMOS transistor 116 is capable of functioning as a switch for disconnecting the driver 101 and the current compensation circuit 102 from each other. Even if a transmission method which performs communication by changing the common mode potential is implemented in the current driver circuit 100 according to the present variation, the disconnection of the current compensation circuit 102 from the current driver 101 allows the foregoing transmission method to be implemented such that the current compensation circuit 102 does not present an obstacle.

In the variation of the second embodiment, the first and second pMOS transistors 115 and 116 may have any of the terminals of the plurality of resistors each connected between the power source potential level $V_{dd}$ and the ground level $V_{ss}$ interposed therebetween.

Although the second pMOS transistor 116 composing the second reference potential generating circuit 114 serves as the switch for disconnecting the current driver 101 and the current compensation circuit 102 from each other, another element or the like may also be provided to be used as a switch.

Embodiment 3

A current driver circuit according to a third embodiment of the present invention will be described herein below with reference to the drawings.

Figure 4:
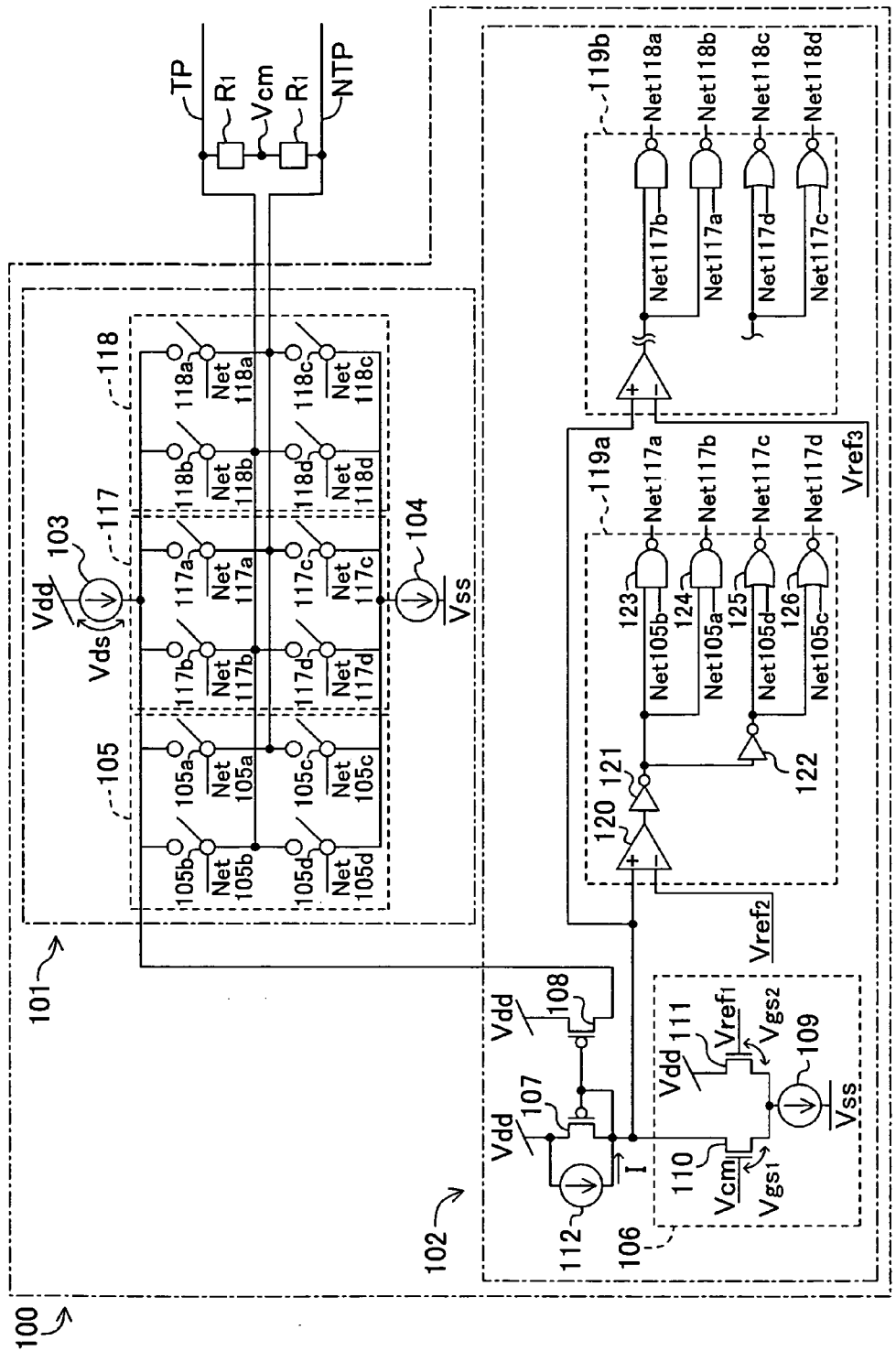
FIG. 4 is a structural view of a current driver circuit according to a third embodiment of the present invention.

FIG. 4 is a structural view of the current driver circuit according to the third embodiment. The same reference numerals are retained for the circuit components and the like of the current driver circuit according to the third embodiment shown in FIG. 4 which are the same as those of the current driver circuit according to the first embodiment shown in FIG. 1. In the subsequent description of the present specification, the switch circuit 105 will be termed the first switch circuit 105.

As shown in FIG. 4, a current driver circuit 100 according to the third embodiment is characterized by second and third switch circuits 117 and 118 each provided in parallel with the first switch circuit 105 composing the current driver 101 of the current driver circuit 100 according to the first embodiment and by first and second logic circuits 119a and 119b provided in the current compensation circuit 102 in conjunction with the second and third switch circuits 117 and 118.

Specifically, the current driver circuit 101 is provided with the second and third switch circuits 117 and 118, each composed of four switch elements, in addition to the first switch circuit 105. The second switch circuit 117 is composed of a fifth switch element 117a composed of a pMOS transistor in parallel relation with the first switch element 105a, a sixth switch element 117b composed of a pMOS transistor in parallel relation with the second switch element 105b, a seventh switch element 117c composed of an nMOS transistor in parallel relation with the third switch element 105c, and an eighth switch element 117d composed of an nMOS transistor in parallel relation with the fourth switch element 105d. The description of the third switch circuit 118 will be omitted since it is essentially the same as that of the second switch circuit 117.

On the other hand, the current compensation circuit 102 is provided with the first logic circuit 119a for controlling the operation of each of the four switch elements composing the second switch circuit 117 of the current driver 101 and with the second logic circuit 119b for controlling the operation of each of the four switch elements composing the third switch circuit 118. Specifically, the first logic circuit 119a is composed of a second comparator 120, a first NOT circuit 121, a second NOT circuit 122, a first NAND circuit 123, a second NAND circuit 124, a first NOR circuit 125, and a second NOR circuit 126. The potential on the drain side of the first nMOS transistor 110 and the second reference potential $V_{ref2}$ are inputted to the second comparator 120. An output signal from the second comparator 120 is inputted to the first NOT circuit 121. An output signal from the first NOT circuit 121 is inputted to the second NOT circuit 122. An output signal from the first NOT circuit 121 and a signal inputted to the gate of the second switch element 105b are inputted to the first NAND circuit 123. The output signal from the first NOT circuit 121 and a signal inputted to the gate of the first switch element 105a are inputted to the second NAND circuit 124. An output signal from the second NOT circuit 122 and a signal inputted to the gate of the fourth switch element 105d are inputted to the first NOR circuit 125. The output signal from the second NOR circuit 122 and a signal inputted to the gate of the third switch element 105c are inputted to the second NOR circuit 126. Consequently, the second switch circuit 117 is controlled by the first logic circuit 119a. The operation of the third switch circuit 118 is also controlled by the second logic circuit 119b similarly constructed to the first logic circuit 119a, though the description thereof will be omitted.

In FIG. 4, NetXy (where X represents an arbitrary number and y represents an arbitrary alphabet) in the current driver 101 and NetXy in the current compensation circuit 102 indicates an equal potential, i.e., that the same signal is inputted to each of the elements.

The third embodiment achieves the following effect in addition to the effects achieved by the current driver circuit according to the first embodiment.

The present embodiment is configured such that the first logic circuit 119a of the current compensation circuit 102 initiates operation when the common mode potential $V_{cm}$ becomes higher than a specified value, whereby the second switch circuit 117 of the current driver 101 is activated. Specifically, the fifth, sixth, seventh, and eighth switch elements 117a, 117b, 117c, and 117d are brought into the same On/Off states as the first, second, third, and fourth switch elements 105a, 105b, 105c, and 105d, respectively. Accordingly, if the common mode potential $V_{cm}$ changes in the direction of the power source potential level $V_{dd}$ to be higher than a specified value, i.e., if the voltage $V_{ds}$ impressed on the both ends of the pMOS current source transistor 103 is not more than a value obtained by subtracting the threshold voltage from the voltage applied to the source and gate, the second switch circuit 117 can be activated. Consequently, the total transistor size of the activated switch element can be increased. This increases the voltage impressed on the both ends of the pMOS current source transistor 103 and thereby allows compensation for a current shortage which occurs when the pMOS current source transistor 103 enters the non-saturated region. If it is impossible to cause the pMOS current source transistor 103 to reach the saturated region only with the second switch circuit 117 activated by the first logic circuit 119a, the second logic circuit 119b is configured to start an operation so that the third switch circuit 118 is successively activated subsequently to the second switch circuit 117. This enhances the effect achieved by activating the second switch circuit 117. Accordingly, differential signals can be outputted stably even during a low-voltage operation in which the power source potential level Vdd is low so that a current driver circuit capable of high-speed differential transmission even if the common mode potential varies in a wide range is implemented.

According to the present embodiment, if the voltage $V_{ds}$ impressed on the both ends of the pMOS current source transistor 103 is sufficiently higher than the value obtained by subtracting the threshold voltage from the voltage applied between the source and gate, the number of the activated ones of the switch elements composing the first, second, and third switch circuits 105, 117, and 118 is reduced. In other words, the total transistor size of the MOS transistors composing the activated switch elements is reduced. This achieves a reduction in switching noise.

Although the switch circuits in parallel relation are provided in three stages, i.e., the switch circuits are composed of the first, second, and third switch circuits 105, 117, and 118 in the present embodiment, the switch circuits may also be provided in two stages or four or more stages.

In the present embodiment, the total transistor size of the activated switch elements is preferably changed non-linearly relative to the difference between the common mode potential $V_{cm}$ and the power source potential level $V_{dd}$. The arrangement achieves a reduction in the number of the switch circuits provided in the current driver 101. This is because, when the pMOS current source transistor 103 enters the non-saturated region, the current flowing in the pMOS current source transistor 103 changes non-linearly relative to the difference between the common mode potential $V_{cm}$ and the power source potential level $V_{dd}$. If the total transistor size of the activated switch elements is changed non-linearly in the same manner, proper compensation of the output current can be performed. This circumvents an excessive increase in the size of each of the switches.

Although the third embodiment has specified the structure of each of the first and second logic circuits 119a and 119b, another structure may also be used provided that it achieves the foregoing effects.

Variation of Embodiment 3

A current driver circuit according to a variation of the third embodiment will be described herein below with reference to the drawings.

Figure 5:
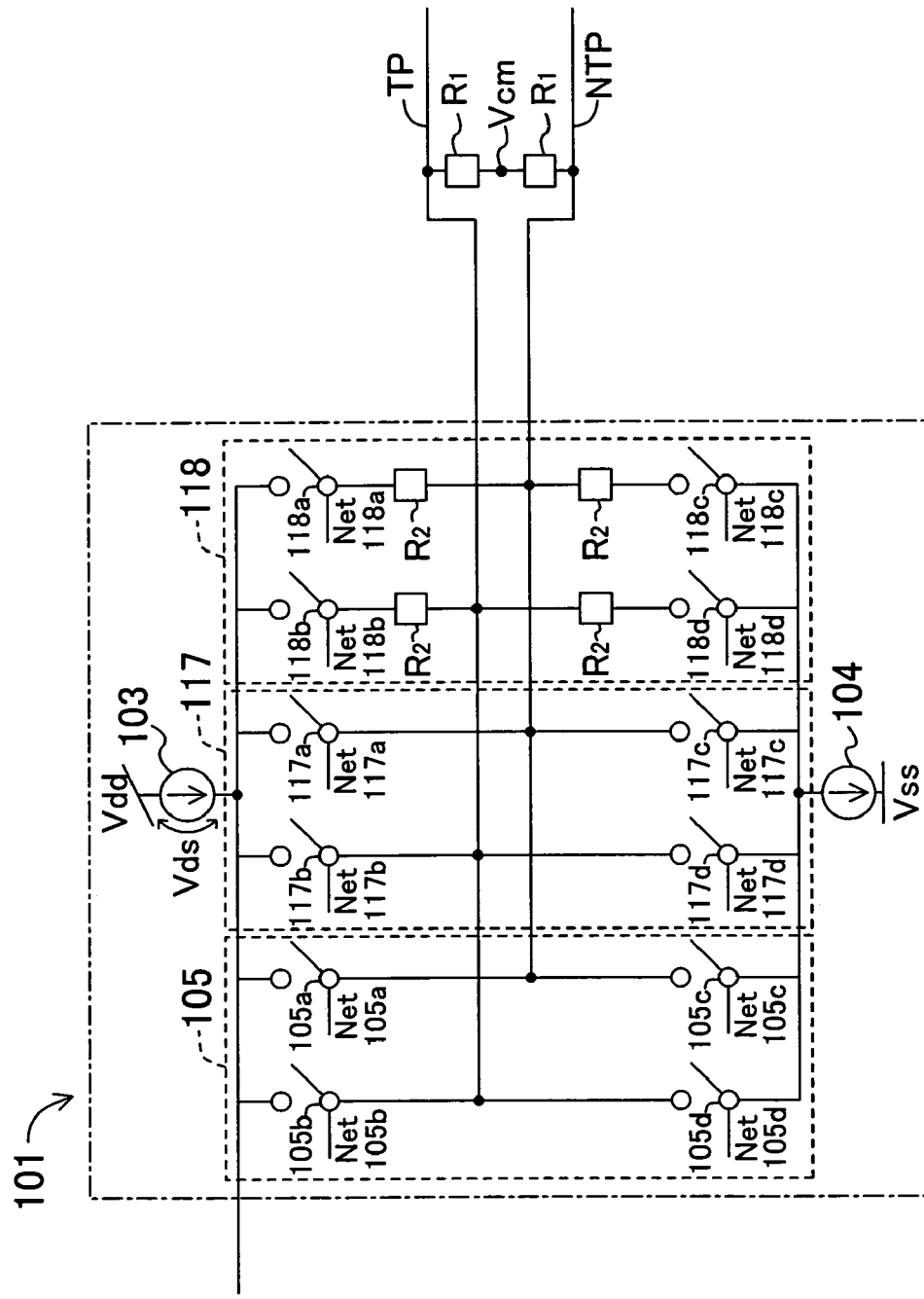
FIG. 5 is a structural view of a current driver composing a current driver circuit according to a variation of the third embodiment.

FIG. 5 is a structural view of a current driver composing the current driver circuit according to the variation of the third embodiment. The current compensation circuit according to the present variation is not depicted herein since it is the same as the current compensation circuit 102 according to the third embodiment shown in FIG. 4. The same reference numerals are retained for the circuit components and the like of the current driver according to the present variation shown in FIG. 5 which are the same as those of the current driver according to the third embodiment shown in FIG. 4.

As shown in FIG. 5, the current driver circuit according to the variation of the third embodiment is characterized by an improvement in the third switch circuit 118 composing the current driver 101 according to the third embodiment. Specifically, two terminal resistors R2 are connected in series between ninth and eleventh switch elements 118a and 118c each composing that one of the switch circuits activated finally, i.e., the third switch circuit 118 and between tenth and twelfth switch elements 118b and 118d each also composing the third switch circuit 118, respectively. The arrangement achieves the following effect in addition to the effects achieved by the third embodiment.

According to the present variation, the activation of the third switch circuit 118 brings the first and second terminal resistors $R_1$ and $R_2$ outside an LSI on which the current driver circuit 100 is mounted into parallel relation. This reduces the overall terminal resistance value and thereby allows the pMOS current source transistor 103 to reach the saturated region more easily than in the case where the second terminal resistors $R_2$ are not connected.

Although the second terminal resistors $R_2$ have been provided in the third switch circuit 118, they may also be provided only in the second switch circuit 117 or in the first switch circuit 105.

Embodiment 4

A current driver circuit according to a fourth embodiment of the present invention will be described herein below with reference to the drawings.

Figure 6:
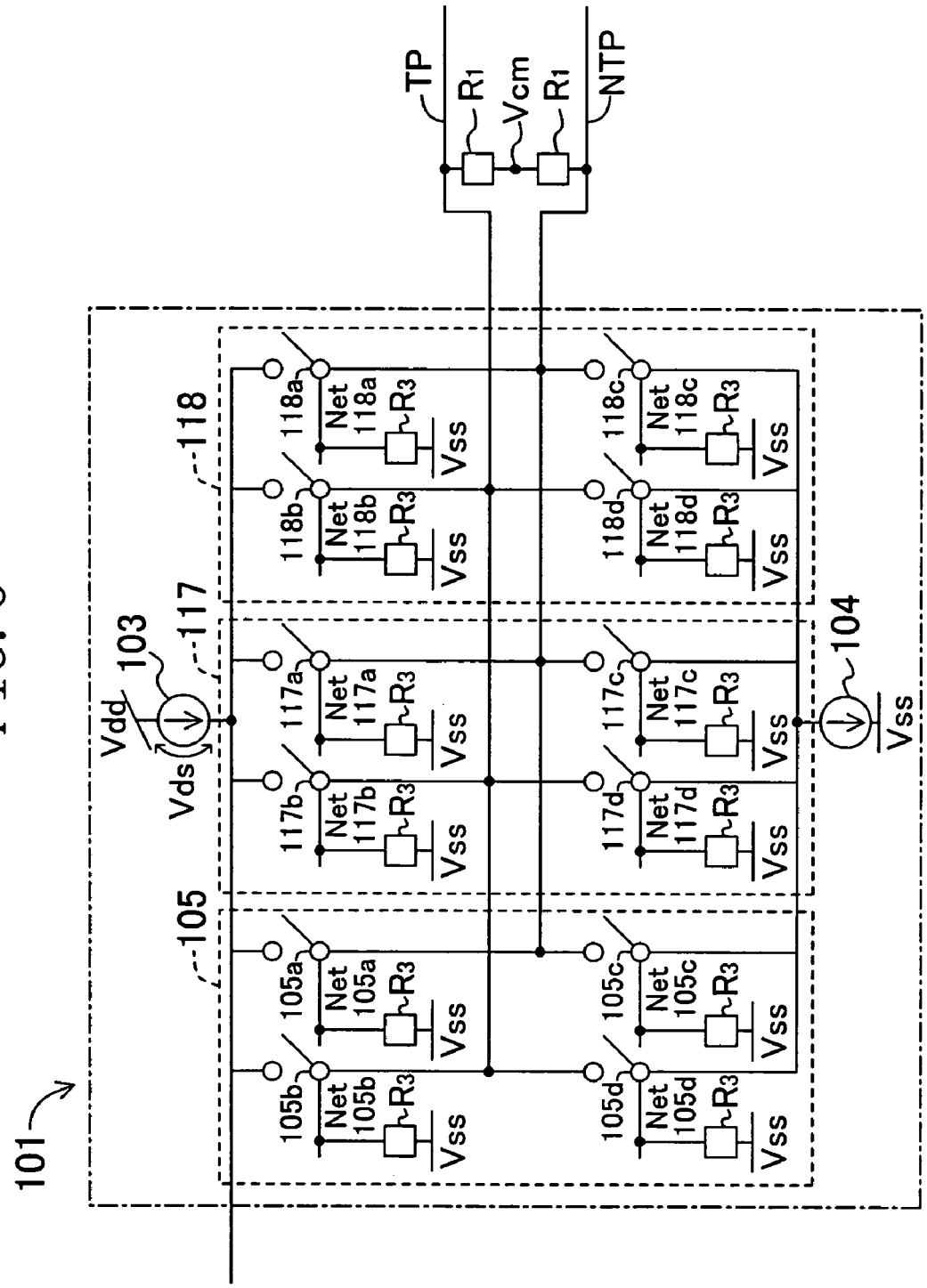
FIG. 6 is a structural view of a current driver composing a current driver circuit according to a fourth embodiment of the present invention.

FIG. 6 is a structural view of a current driver composing the current driver circuit according to the fourth embodiment. The current compensation circuit according to the present embodiment is not depicted herein since it is the same as the current compensation circuit 102 according to the third embodiment shown in FIG. 4. The same reference numerals are retained for the circuit components and the like of the current driver according to the fourth embodiment shown in FIG. 6 which are the same as those of the current driver according to the third embodiment shown in FIG. 4.

As shown in FIG. 6, the current driver circuit according to the fourth embodiment is characterized by improvements in the switch circuits composing the current driver 101 according to the third embodiment shown in FIG. 4. Specifically, the switch circuits according to the present embodiment are characterized in that the respective gates of the switch elements composing the first, second, and third switch circuits 105, 117, and 118 are connected to the ground level $V_{ss}$ via respective third terminal resistors $R_3$. The arrangement achieves the following effect in addition to the effects achieved by the third embodiment.

According to the present embodiment, the respective gates of the switch elements are connected to the ground level via the individual third terminal resistors $R_3$ so that the probability that each of the switch elements becomes a source for generating noise depending on the size thereof is minimized. If a line connected for the inputting of a signal to the gate of the switch element is elongated, the problem of signal reflection results from the relationship between frequency and phase. Through connection to the ground level via the third terminal resistors $R_3$, the problem can be lessened.

Although the third terminal resistor $R_3$ has been connected to each of the switch elements in the fourth embodiment, it need not be connected to each of the switch elements.

Variation of Embodiment 4

A current driver circuit according to a variation of the fourth embodiment will be described herein below with reference to the drawings.

Figure 7:
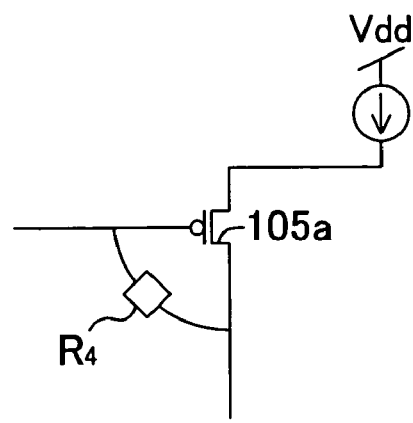
FIG. 7 is a structural view of an exemplary switch element in the current driver composing the current driver circuit according to the fourth embodiment.
Figure 8:
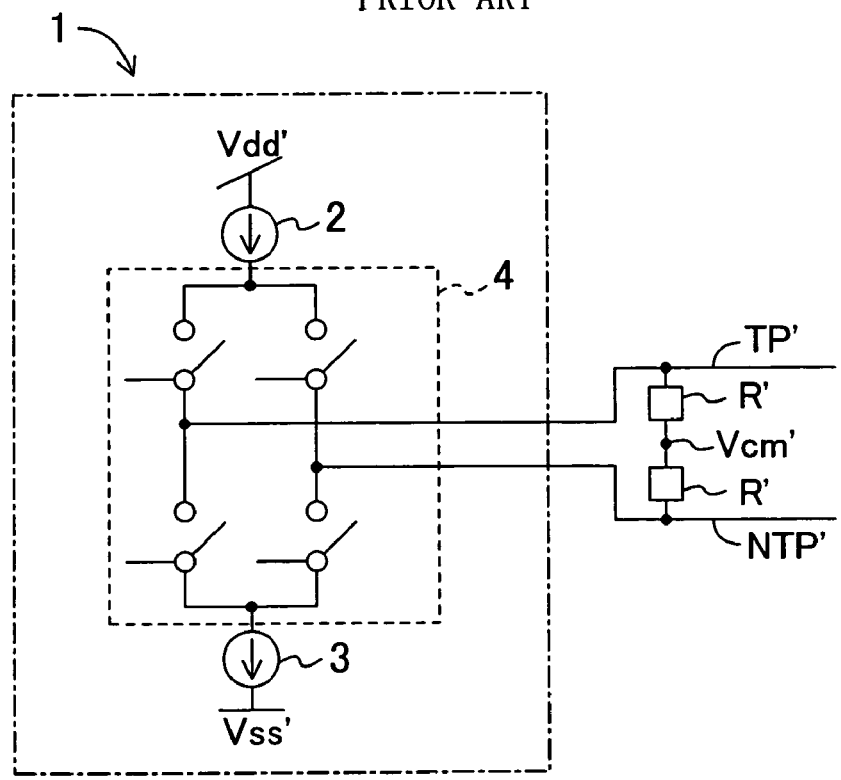
FIG. 8 is a structural view of a conventional current driver circuit.

FIG. 7 is a structural view of a current driver composing the current driver circuit according to the variation of the fourth embodiment, which particularly shows the first switch element 105a composing the first switch circuit 105 as an example. The same reference numerals are retained for the circuit components and the like of the current driver according to the variation of the fourth embodiment shown in FIG. 7 which are the same as those of the current driver according to the fourth embodiment shown in FIG. 6.

As shown in FIG. 7, the current driver circuit according to the variation of the fourth embodiment is characterized by the first switch element 105a composing the first switch circuit 105 in the current driver 101 according to the fourth embodiment shown in FIG. 6.

According to the present variation, the first switch element 105a composing the first switch circuit 105 has a gate and a drain connected to each other via a fourth terminal resistor $R_4$. It is to be noted that the fourth terminal resistor $R_4$ indicates a virtual terminal resistor. That is, it is indicated that the fourth terminal resistor $R_4$ is connected virtually by using the path of a leakage current flowing from the gate of the first switch element 105a. Instead of connecting the third terminal resistors $R_3$ used in the current driver 101 according to the fourth embodiment shown in FIG. 6, if a MOS transistor forming the switch element is miniaturized such that the leakage current flows in the gate of the MOS transistor, the virtual fourth terminal resistor $R_4$ shown in FIG. 7 can be produced. This reliably achieves the effect achieved by the fourth embodiment.

Although the variation of the fourth embodiment has been described by using the first switch element 105a composing the first switch circuit 105 as an example, the other switch elements may also be miniaturized similarly.

What is claimed is:

1. A current driver circuit for driving a pair of transmission lines by allowing a current to flow in a terminal resistor connected between the pair of transmission lines, the current driver circuit comprising:
    a current driver having a current source transistor connected to a power source potential level, the current driver being coupled to the pair of transmission lines; and
    a current compensation circuit for compensation of an output current from the current driver in response to a common mode potential of the pair of transmission lines, the current compensation circuit being coupled to an output side of the current source transistor, and
    wherein the current compensation circuit increases the output current by an amount substantially equal to the amount of reduction in the output current caused by the current source transistor entering a non-saturated region.

2. The current driver circuit of claim 1, wherein the current compensation circuit comprises:
    a plurality of resistors connected in series between the power source potential level and a ground level;

a comparator for making a comparison between a terminal potential of each of the plurality of resistors and the common mode potential;

a load transistor activated by a reversal of a magnitude relationship between the common mode potential inputted to the comparator and the terminal potential; and a Miller transistor for supplying, to the current driver, a current directly proportional to a current flowing in the load transistor.

3. The current driver circuit of claim 2, wherein the current compensation circuit further comprises a transistor provided between the power source potential level and the ground level and connected in series to the plurality of resistors.

4. The current driver circuit of claim 2, wherein the comparator comprises a first nMOS transistor having a gate to which the common mode potential is inputted, a second nMOS transistor having a gate to which the terminal potential is inputted, and a first current source having one end connected to each of the first and second nMOS transistors, the load transistor is composed of a pMOS transistor connected in parallel to a second current source and having one end connected to the first nMOS transistor, and the current supplied from the Miller transistor to the current driver is given by:

$$\{\beta \times (V_{gs} - V_t)^2 - I\} \times \alpha$$

(where $V_{gs}$ is a potential difference between a source and the gate of the first nMOS transistor, $V_t$ is a threshold voltage of the first nMOS transistor, $\beta$ is a constant determined by a channel width and a channel length of the first nMOS transistor, I is a current flowing in the second current source, and $\alpha$ is a Miller ratio of a drain current of the Miller transistor to a drain current of the load transistor).

5. A current driver circuit for driving a pair of transmission lines by allowing a current to flow in a terminal resistor connected between the pair of transmission lines, the current driver circuit comprising:

a current driver having a plurality of switch circuits for controlling a current flowing in the pair of transmission lines; and a current compensation circuit for controlling stepwise respective operations of the plurality of switch circuits in response to a variation in a common mode potential of the pair of transmission lines, and wherein the current compensation circuit operates activate the plurality of switch circuits on an individual basis as a difference between a power source potential level and the common mode potential is reduced.

6. The current driver circuit of claim 5, wherein the specified one of the plurality of switch circuits comprises a resistor connected in series between a switch element composing the specified switch circuit and one of the pair of transmission lines.

7. The current driver circuit of claim 5, wherein each of switch elements composing the plurality of switch circuits is composed of a MOS transistor and the MOS transistor has a gate connected to a ground level via a given resistor.

8. The current driver circuit of claim 5, wherein plurality of switch circuits are coupled together in a parallel configuration.

* * * * *